US011139227B2

United States Patent
(12) United States Patent
Bonifield

(10) Patent No.: US 11,139,227 B2
(45) Date of Patent: Oct. 5, 2021

(54) LAMINATE STACKED ON DIE FOR HIGH VOLTAGE ISOLATION CAPACITOR

(71) Applicant: Texas Instruments Incorporated, Dallas, TX (US)

(72) Inventor: Thomas Dyer Bonifield, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 14 days.

(21) Appl. No.: 16/806,362

(22) Filed: Mar. 2, 2020

(65) Prior Publication Data

US 2021/0272886 A1 Sep. 2, 2021

(51) Int. Cl.

| | |
|---|---|
| ***H01L 23/498*** | (2006.01) |
| ***H01L 23/64*** | (2006.01) |
| ***H01L 25/065*** | (2006.01) |
| ***H01L 49/02*** | (2006.01) |
| ***H01L 21/48*** | (2006.01) |
| ***H01L 23/00*** | (2006.01) |
| ***H01L 25/00*** | (2006.01) |

(52) U.S. Cl.

CPC .... *H01L 23/49811* (2013.01); *H01L 21/4853* (2013.01); *H01L 23/642* (2013.01); *H01L 24/45* (2013.01); *H01L 24/85* (2013.01); *H01L 25/0655* (2013.01); *H01L 25/50* (2013.01); *H01L 28/40* (2013.01)

(58) Field of Classification Search

CPC ........................................................ H01L 25/50

See application file for complete search history.

(56) References Cited

U.S. PATENT DOCUMENTS

2006/0186450 A1 * 8/2006 Larkin .................... H01L 29/94 257/306
2013/0037909 A1 * 2/2013 French .................... H01L 23/48 257/532
2016/0133690 A1 5/2016 West et al.
2018/0286802 A1 * 10/2018 West ................. H01L 23/53295
2019/0206812 A1 * 7/2019 Bonifield .............. B81B 7/0032
2020/0035617 A1 * 1/2020 Stewart ................... H01L 28/40
2021/0065955 A1 * 3/2021 Lambkin ............. H01F 17/0006

* cited by examiner

*Primary Examiner* — Yu-Hsi D Sun

(74) *Attorney, Agent, or Firm* — Ronald O. Neerings; Charles A. Brill; Frank D. Cimino

(57) ABSTRACT

An isolator device includes a laminate die having a dielectric laminate material with a metal laminate layer on one side of the dielectric laminate material, the metal laminate layer being a patterned layer providing at least a first plate, including a dielectric layer over the first plate that includes an aperture exposing a portion of the first plate. An integrated circuit (IC) including a substrate having a semiconductor surface includes circuitry including a transmitter and/or a receiver, the IC including a top metal layer providing at least a second plate coupled to a node in the circuitry, with at least one passivation layer on the top metal layer. A non-conductive die attach (NCDA) material for attaching a side of the dielectric laminate material is opposite the metal laminate layer to the IC so that the first plate is at least partially over the second plate to provide a capacitor.

20 Claims, 7 Drawing Sheets

LAMINATE STACKED ON DIE FOR HIGH VOLTAGE ISOLATION CAPACITOR

FIELD

This Disclosure relates to high-voltage isolator devices.

BACKGROUND

Galvanic isolation is a principle of isolating functional sections of electrical systems to prevent current flow between the sections. In order to provide galvanic isolation, no direct conduction (DC) path is permitted. Energy or information may still be exchanged between the sections by other means, such as capacitance, induction or electromagnetic waves, or by optical, acoustic or mechanical means.

Galvanic isolation is commonly used where two or more electronic circuits need to communicate, but their grounds may be at different potentials. Galvanic isolation is an effective method of breaking ground loops by preventing unwanted current from flowing between two units sharing a ground conductor. Galvanic isolation is also used for safety, preventing accidental current from reaching ground through a person's body.

Previously, designers of industrial, medical, and other isolated systems had limited options when implementing safety isolation; the only reasonable choice was the optocoupler. Digital isolators currently offer advantages in performance, size, cost, power efficiency, and integration. Isolation imposes constraints such as delays, power consumption, cost, and size. A digital isolator's goal is to meet safety requirements while minimizing incurred penalties.

Digital isolators couple data across an isolation barrier. This is achieved by using a modulator to transmit a high-frequency carrier across the barrier to represent either a high digital state or a low digital state, and no signal to represent the other digital state. The receiver demodulates the signal after advanced signal conditioning to produce an isolated output through a buffer stage.

High voltage (HV) isolator devices are generally built with dedicated wafer fabrication process technologies and HV components within that process technology. The HV isolation generally comprises optical isolation, capacitive isolation, or inductive isolation. The isolation structure is generally between a first IC and a second IC.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize the problem of high cost, and a large footprint for conventional HV isolator device technology which is generally limited to a single base silicon fabrication technology. These problems are solved by disclosed aspects which create a capacitive isolator device having an HV capacitor by stacking a laminate die having a laminate metal layer providing a first plate using a non-conductive die attach (NCDA) material onto an IC having a top metal layer including a second plate. The dielectric of the HV capacitor comprises the laminate die's generally relatively thick dielectric laminate, the NCDA, and the passivation layer on the IC, that is between the first plate and the second plate, with communication provided by capacitive coupling through these respective dielectrics.

Disclosed aspects include an isolator device that comprises a laminate die having a dielectric laminate material with a metal laminate layer on one side of the dielectric laminate material, the metal laminate layer being a patterned layer providing at least a first plate, including a dielectric layer over the first plate that includes an aperture exposing a portion of the first plate. An IC including a substrate having a semiconductor surface includes circuitry including a transmitter and/or a receiver, the IC including a top metal layer providing at least a second plate coupled to a node in the circuitry, with at least one passivation layer on the top metal layer. A NCDA material is for attaching a side of the dielectric laminate material that is opposite the metal laminate layer to the IC so that the first plate is at least partially over the second plate to provide a capacitor.

BRIEF DESCRIPTION OF THE DRAWINGS

Reference will now be made to the accompanying drawings, which are not necessarily drawn to scale, wherein.

DETAILED DESCRIPTION

Figure 1:
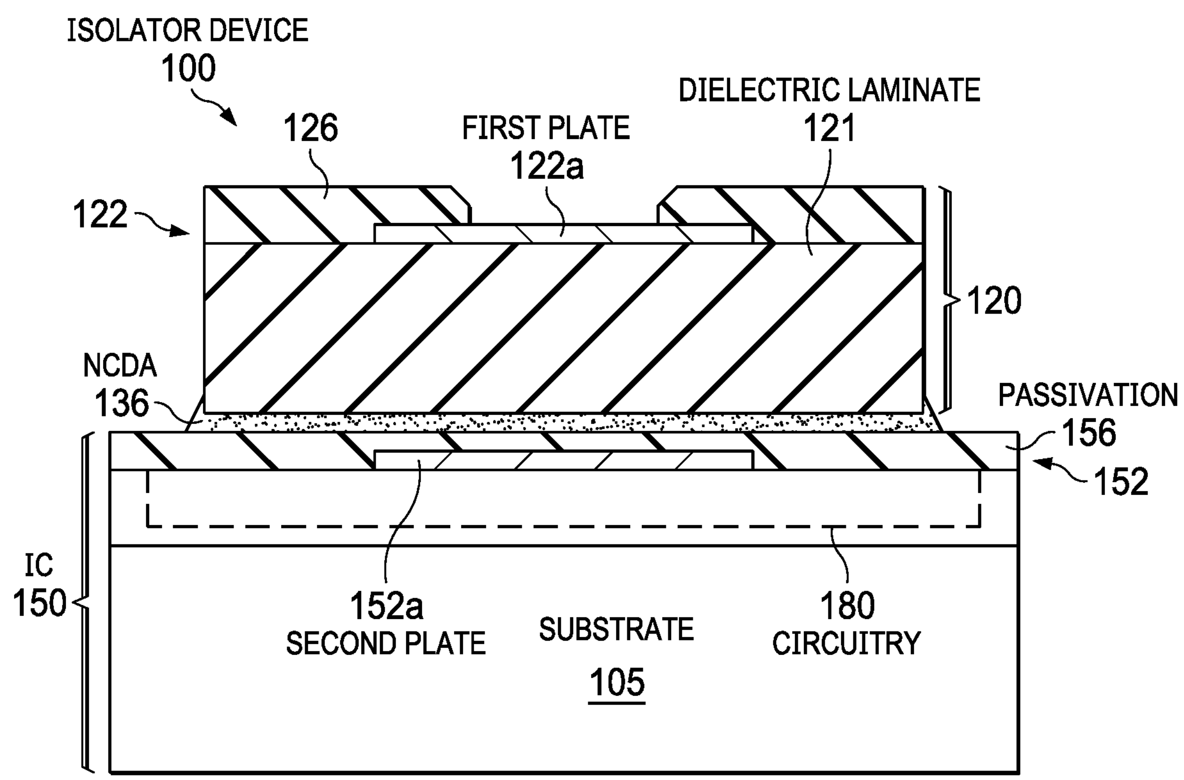
FIG. 1 is a cross-sectional view of an example capacitive isolator device, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Disclosed aspects recognize capacitive isolator devices have two parts, a thick dielectric material for providing HV isolation, and a communication method from a transmit (Tx) circuit to a receive (Rx) circuit, which may be optical, capacitive or inductive. Disclosed capacitive isolators include an IC and a laminate die that collectively provide at least one HV capacitor and utilize capacitive communication, where the thick dielectric material of the HV capacitor comprises the stacked combination of three materials including a laminate dielectric, such as bismaleimide triazine (BT) laminate commonly used for iso-laminate products, a NCDA, and passivation layer (also known as protective overcoat) on the IC. The capacitive communication is between a second plate provided by the top metal layer of the IC and a first plate provided by metal laminate layer of a laminate die that is stacked on top of the IC.

FIG. 1 is a cross-sectional view of an example capacitive isolator device 100, according to an example aspect. The capacitive isolator device 100 includes a laminate die 120. Generally, the laminate die 120 is singulated from a two-dimensional array of laminate die. The laminate die 120 comprises a dielectric laminate material 121 with a metal laminate layer 122 on one side of the dielectric laminate material 121.

The metal laminate layer 122 is patterned layer providing a first plate 122*a*. There is a dielectric layer 126 over the first plate 122*a* that includes an aperture exposing an inner portion of the first plate 122*a* that enables placing a bondwire on the first plate 122*a*. The dielectric layer 126 generally comprises a photoimageable polymer material that is non-electrically conductive, that is also compatible with the packaging process and the mold compound material. Such a photoimageable polymer material is commonly referred as being a solder mask material.

Although the laminate die 120 is shown in FIG. 1 being only slightly smaller in its planar dimension as compared to the IC 150, the laminate die 120 is generally only a small fraction of the area of the IC 150, such as being smaller in area as compared to the second plate 152*a* so that the laminate die 120 may have the size of a conventional bond pad, so for example the laminate die 120 may be on the order of 0.1% of the size of the IC 150. This enables bond pads of the IC 150 connected to nodes in the circuitry 180 to be accessed to, which also enables the bond pads of the IC 150 to be bonded to despite the laminate die 120 being on top of the IC 150. Although the laminate die 120 shown in FIG. 1 has only a single first plate 122*a*, the laminate die 120 can have a plurality of first plates 122*a* to enable the isolator device 100 (with a plurality of second plates 152*a* from the IC 150) to provide a plurality of disclosed HV capacitors. It is also possible to have two or more laminate die 120 to be placed side-by-side on a single IC 150 to also provide a plurality of disclosed HV capacitors.

The IC 150 comprises a substrate 105 having a semiconductor surface (for example comprising silicon including an optional epitaxial layer thereon) including circuitry 180 configured for a function that is generally in addition to the receiving or transmitting function, where the IC 150 includes a top metal layer 152 (which optionally can be the only metal interconnect layer on the IC 150) providing at least a second plate 152*a*. The second plate 152*a* is coupled to a node in the circuitry 180, with at least one passivation layer 156 on the top metal layer 152. The passivation layer 156 is generally over the full area of the second plate 122*a* as shown, and provides apertures for bond pads of the IC 150.

The first plate 122*a* and the second plate 152*a* can be seen to be overlapping one another, and to also optionally have the same dimension in the direction shown in FIG. 1, which can have the same shape and the same area as well. In the assembly process described below for forming a disclosed capacitive isolator device, there is generally a need for alignment between the laminate die 120 and the IC 150, such as a 40 μm maximum misalignment, to maximize the capacitance value of the HV capacitor(s). Regarding the structures needed for this alignment for the capacitive isolator device 100, the IC 150 generally has alignment marks outside the area of the laminate die 120 for the placement tool to utilize, wherein in one example the alignment marks have the shape of a + sign.

The circuitry 180 provided by the IC 150 comprises circuit elements (including transistors, and generally diodes, resistors, capacitors, etc.) which may be formed in an epitaxial layer on a bulk substrate material configured together for generally realizing at least one circuit function generally besides the transmit or receive function. Example additional circuit functions include analog and mixed analog (e.g., analog-to-digital converter, digital to analog converter, amplifier, gate drivers or power converters), radio frequency (RF), digital, or non-volatile memory functions.

The capacitive isolator device 100 also includes an NCDA material 136 for attaching a bottom side of the dielectric laminate material 121 that is opposite the metal laminate layer 122 to the top side of the IC 150 so that the first plate 122*a* is at least partially over the second plate 152*a* to provide a HV capacitor. The NCDA material 136 can generally be any polymeric adhesive which is non-electrically conductive, and which can be dispensed onto the IC 150 to a thickness of 25 to 50 μm prior to attaching the laminate die 120. A common example for an NCDA material 136 comprises an epoxy-based material provided by Abelstik called LOCTITE ABLEBOND 84-3, with this being a heat curable polymer material whose actual composition is proprietary. Although the isolator device 100 is shown having a single disclosed HV capacitor, as noted above there can be a plurality of disclosed HV capacitors by including an IC including a plurality of second plates 152*a*, and plurality of first plates 122*a* on a single laminate die 120, or by including a plurality of laminate die 120, such as for the capacitive isolator device 100 shown in FIGS. 2A and 2B described below.

Advantages of disclosed capacitive isolator devices include a smaller overall die footprint enabled by die stacking of the laminate die 120 to the IC 150 which provides a relatively small package, or can be used to provide a larger IC with higher functionality. Regarding a disclosed capacitive isolator device package, there is provided independence of the isolator device from the IC device fabrication process technology, and cost savings because the disclosed process and the assembly process are unrelated to the die fabrication process which enables improving the cost and the functional performance.

Figure 2A:
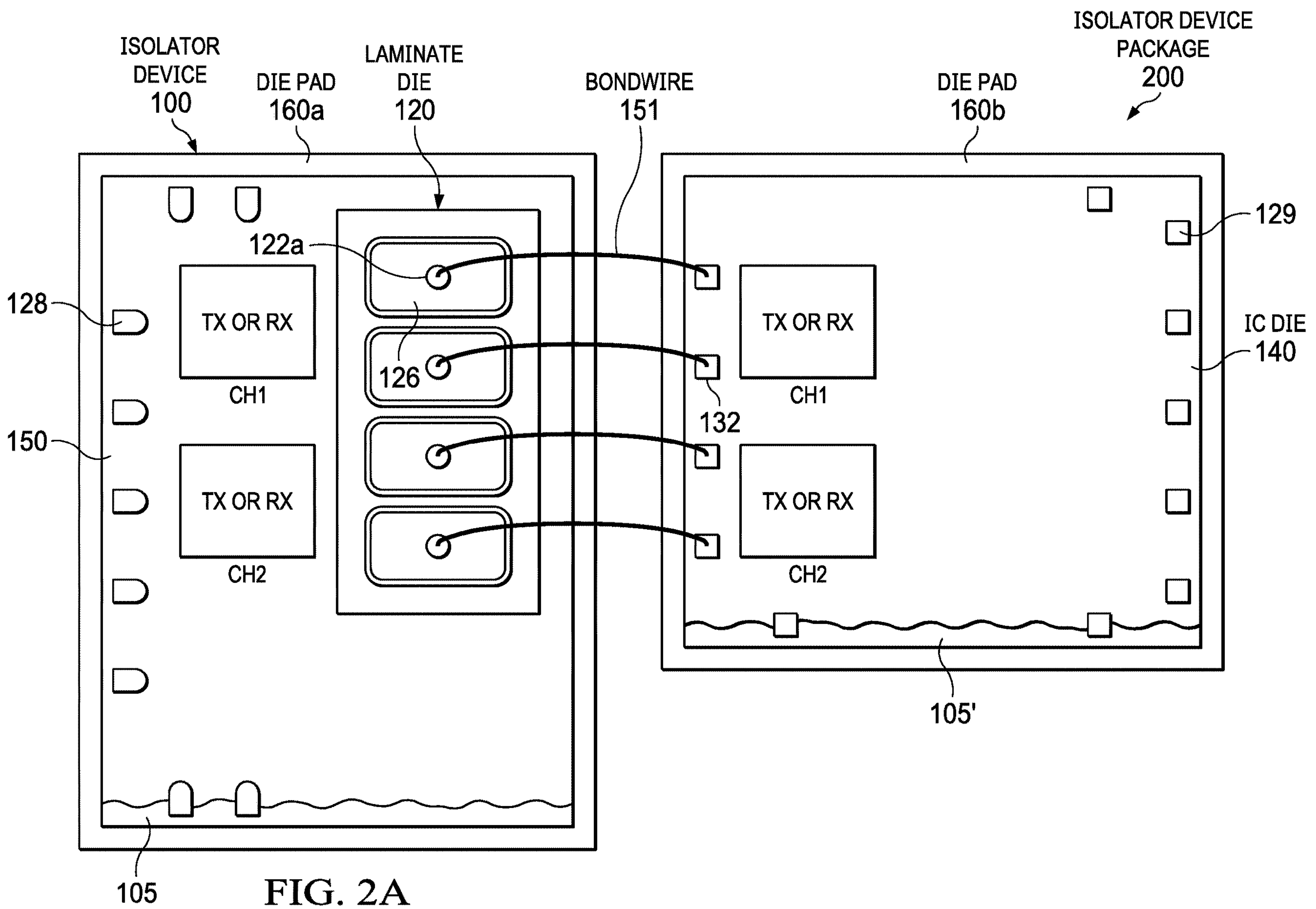
FIG. 2A is a depiction of an isolator device package utilizing single capacitor isolation comprising a leadframe having a split die attachment pad (DAP), with a capacitive isolator device mounted on a first die pad portion of the split DAP, and a second IC mounted on a separate second die pad portion of the split DAP, and bondwires between the first plates and bond pads that are on the second IC, according to an example aspect. For simplicity, the leads and the mold compound are not shown.

FIG. 2A is a depiction of an isolator device package 200 utilizing single capacitor isolation comprising a leadframe having a split DAP, comprising a capacitive isolator device shown as the capacitive isolator device 100 mounted on a first portion 160*a* of the split DAP, and a second IC 140 mounted on a separate portion 160*b* of the split DAP. There are bondwires 151 shown between the first plates 122*a* of the capacitive isolator device 100 and the bond pads 132 on the second IC 140. The isolator device package 200 is shown supporting two differential data channels, shown as CH1 and CH2, with each channel utilizing two disclosed HV capacitors to support a differential signal, with this specific channel arrangement shown only as an example. As shown in FIG. 2A, each IC 140 and IC 150 both include transmitter and/or receiver circuitry, shown as Tx or Rx, configured so that the isolator device package 200 supports two differential data channels.

There are outside bond pads 128 on the top surface of the substrate 105 of the IC 150, and outside bond pads 129 on the top surface of the substrate 105' of the IC 140. The outside bond pads 128 can be used for attaching bondwires, such as between the outside bond pads 128 and leads or lead terminals of a leadframe.

Figure 2B:
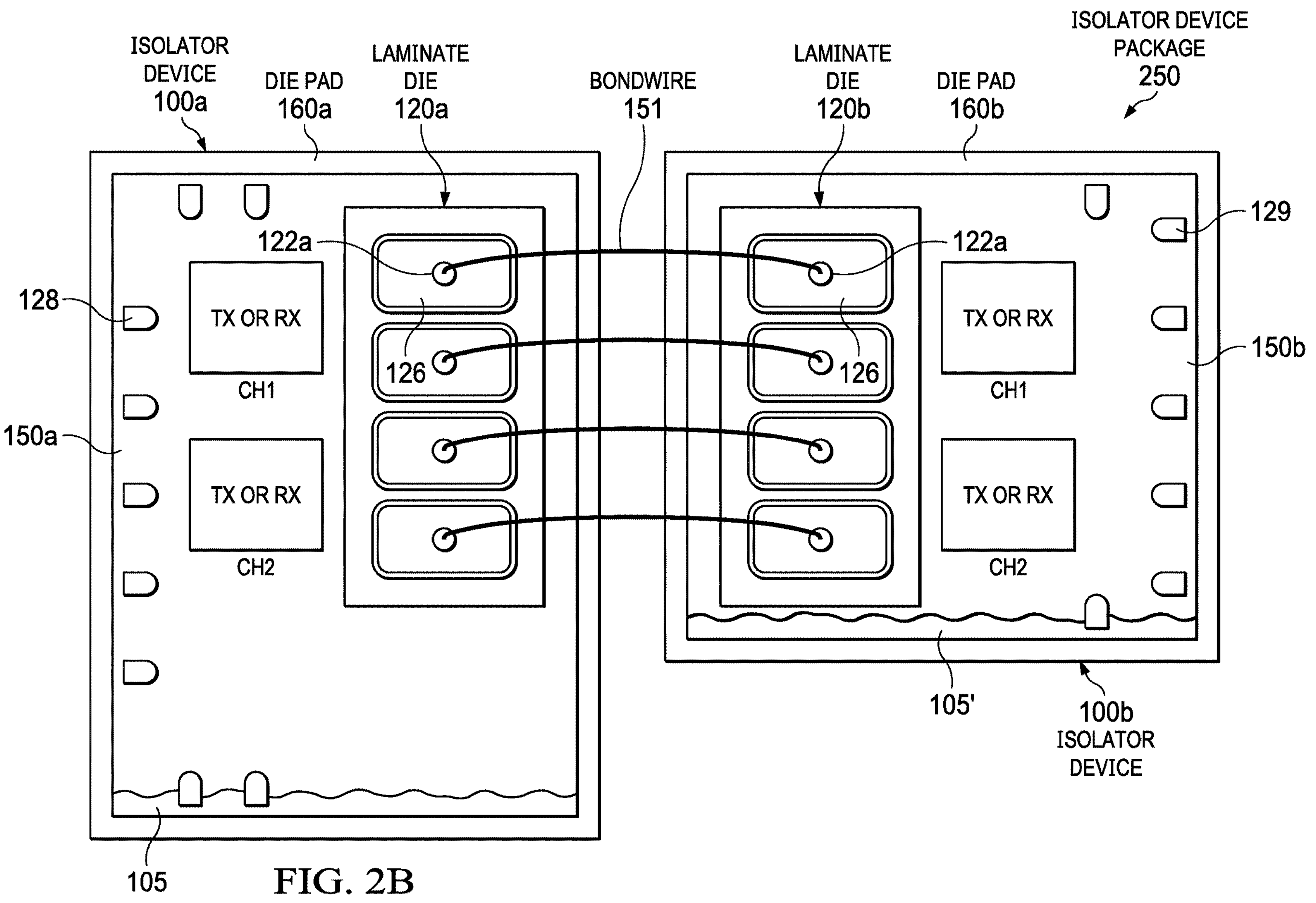
FIG. 2B is a depiction of an isolator device package modified from the isolator device package shown in FIG. 2A to now utilize series capacitor isolation, where the IC to the right in FIG. 2A has been replaced by another isolator device. As known in the art, series capacitor isolation including two capacitors in series provides a higher breakdown voltage (2 times the breakdown voltage of the capacitors if the capacitors are identical) as compared to a single one of the capacitors alone.

FIG. 2B is a depiction of an isolator device package 250 modified from the isolator device package 200 shown in FIG. 2A to now utilize series capacitor isolation (shown as two capacitors in series), where the second IC 140 shown in FIG. 2A has been replaced by another capacitive isolator device now shown as 100*b*, and the capacitive isolator device 100 shown in FIG. 2A is now shown as 100*a*. Both capacitive isolator devices 100*a*, 100*b* include a disclosed laminate die 120*a*, 120*b*, on their respective IC shown as 150*a*, 150*b*. As known in the art, series capacitor isolation including two capacitors in series provides a higher breakdown voltage (2 times the breakdown voltage of the capacitors if the capacitors are identical) as compared to a single one of the HV capacitors standing alone. Disclosed HV capacitors generally provide a breakdown voltage of at least one thousand volts.

Figure 2C:
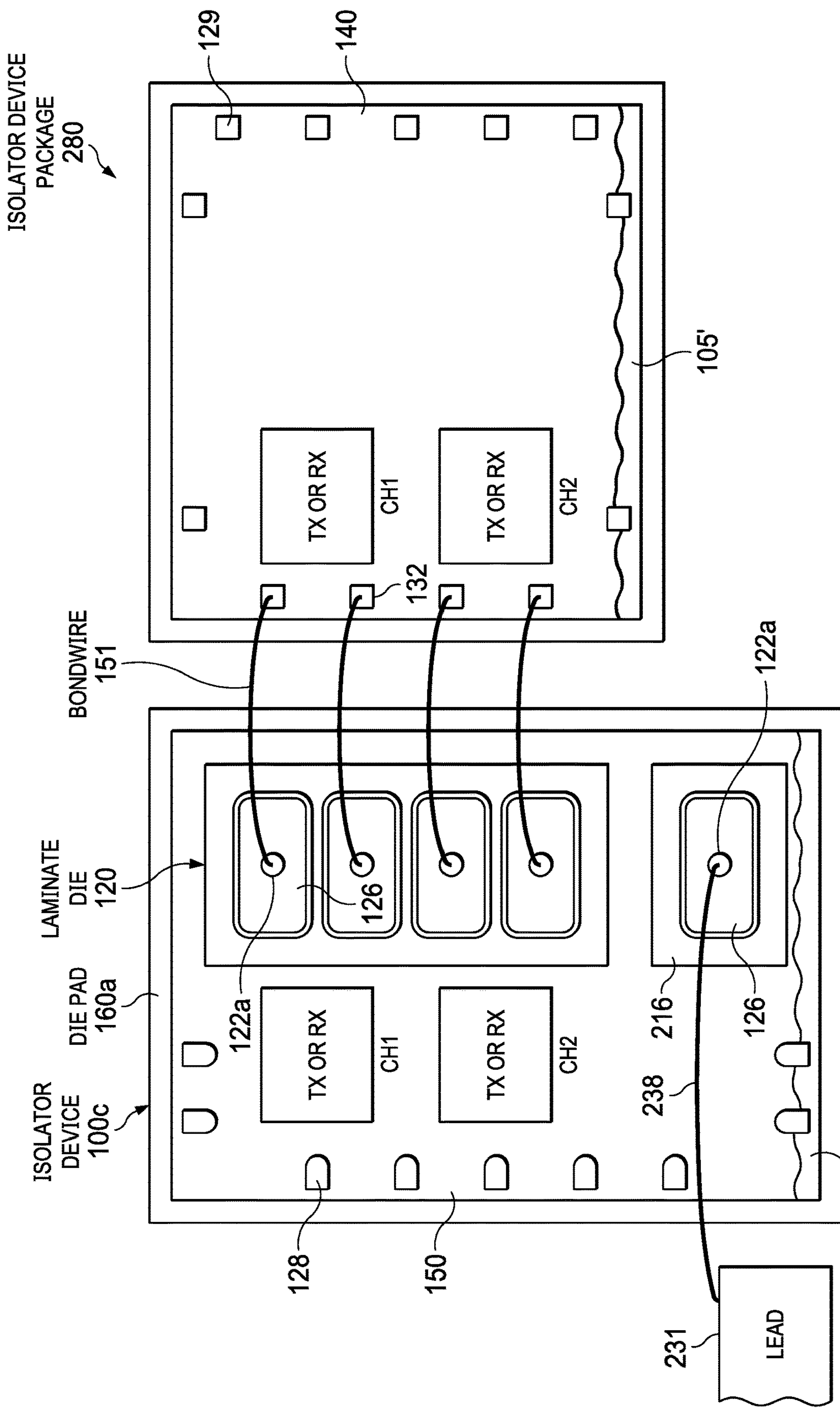
FIG. 2C is a depiction of an isolator device package modified from the isolator device package shown in FIG. 2A to add an optional additional capacitor coupled by a bondwire to a lead for sensing a voltage provided to the isolator device package on the side of the isolator device.

FIG. 2C is a depiction of an isolator device package 280 modified from the isolator device package shown in FIG. 2A to add an optional additional capacitor comprising an HV sensing capacitor 216 that is shown coupled by a bondwire 238 to a lead of a leadframe shown as 231 for sensing a voltage provided to the isolator device package 200 on the side of the capacitive isolator device now shown as 100*c*. The HV sensing capacitor 216 can be provided by another laminate die, or by the laminate die 120. The HV sensing capacitor 216 can be used to provide an analog signal that is proportional to a HV that is present on the capacitive isolator device 100*c* side of the isolation barrier. In this case, the HV sensing capacitor 216 senses a HV and includes associated analog signal generation circuitry which can be within the circuitry 180 shown. This HV sensing capacitor 216 and associated analog signal generation circuitry is not used to communicate across the isolation barrier.

Figure 3A:
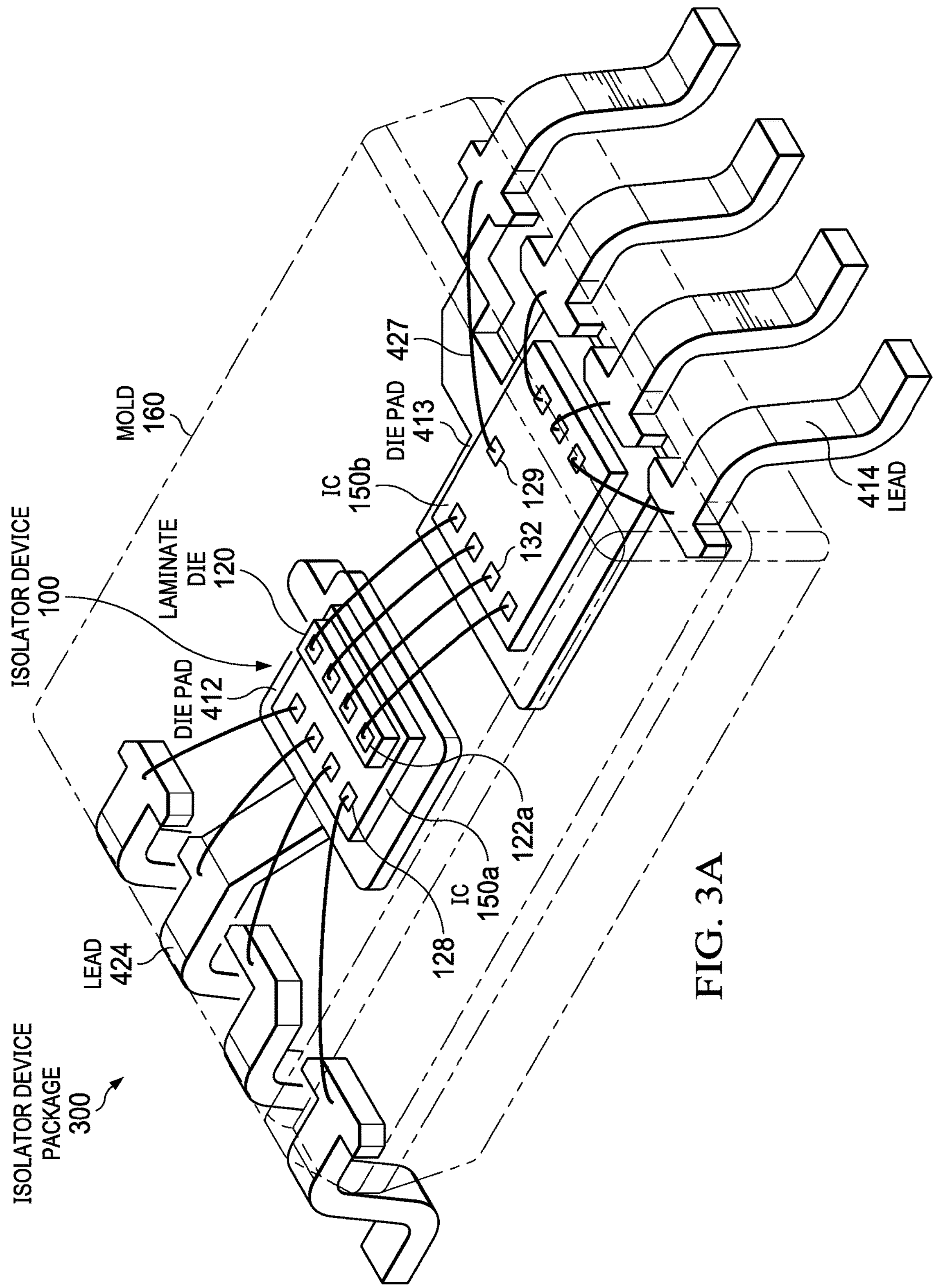
FIG. 3A is a depiction of an isolator device package comprising a leadframe having a split DAP, according to an example aspect. There is a capacitive isolator device mounted on a first portion of the split DAP, a second IC mounted on a separate portion of the split DAP, and bondwires between the first plates and bond pads on the second IC, where the leads and the mold compound are shown.

FIG. 3A is a depiction of an isolator device package 300 comprising a leadframe having a split DAP, with a capacitive isolator device 100 mounted on a first portion 412 of the split DAP, a second IC mounted 150*b* on a separate portion 413 of the split DAP, and there are bondwires between the first plates 122*a* and bond pads 132 on the second IC. Leads 424 and the mold compound 160 are shown. As with the capacitive isolator device 100 shown in FIG. 1, the capacitive isolator device 100 comprises a laminate die 120 on an IC now shown as 150*a*, wherein in this arrangement the circuitry on IC 150*a* includes a transmitter and/or a receiver, and generally circuitry for realizing at least one other function.

Figure 3B:
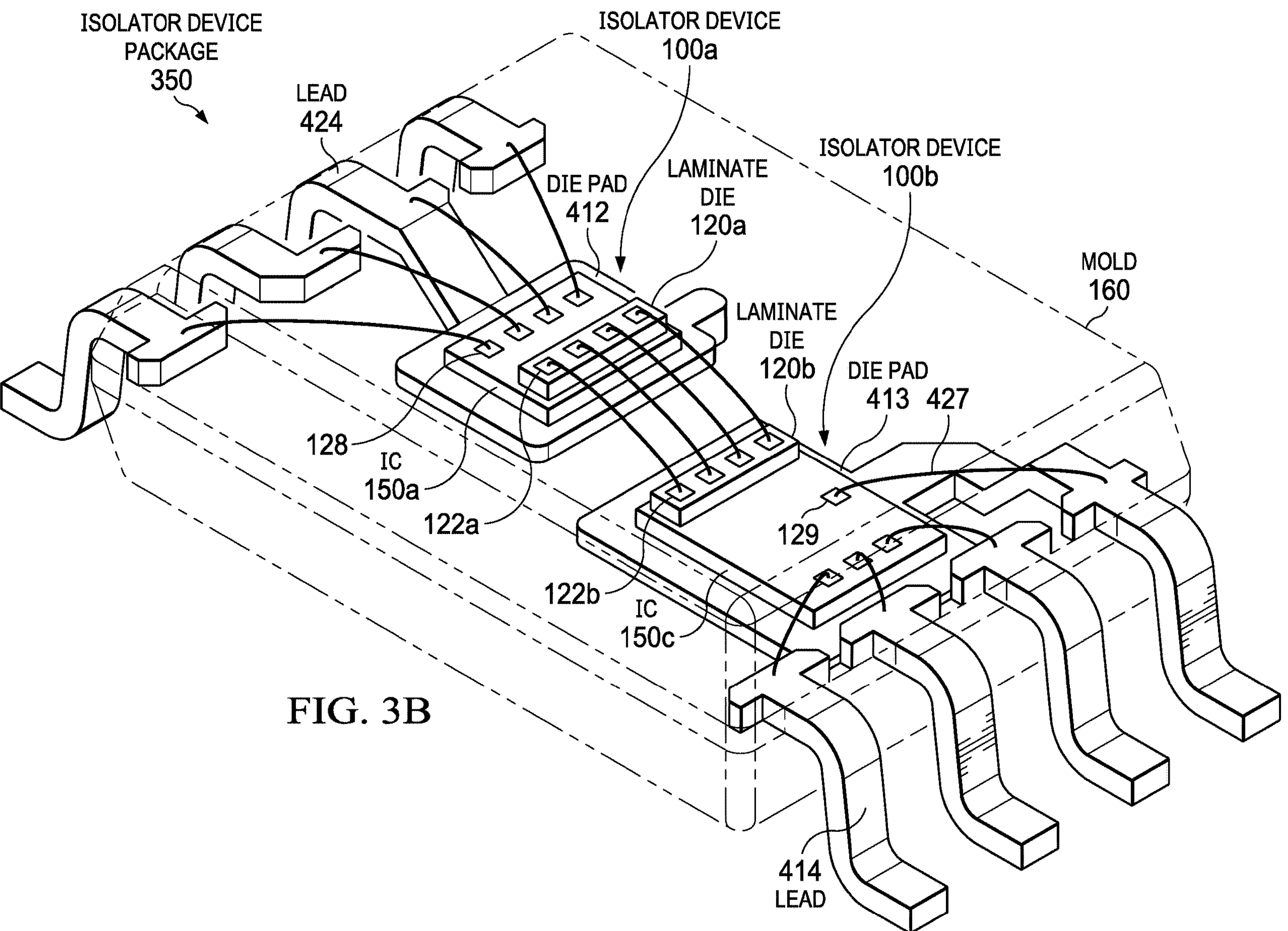
FIG. 3B is a depiction of an example isolator device package comprising a leadframe having a split DAP, according to an example aspect. There is a capacitive isolator device including a laminate die on an IC including a transmitter and/or receiver mounted on a first portion of the split DAP, and another capacitive isolator device including a laminate die on an IC including a transmitter and/or receiver mounted on a separate portion of the split DAP.

FIG. 3B is a depiction of an example isolator device package 350 comprising a leadframe having a split DAP. There is a capacitive isolator device 100*a* including a laminate die 120*a* on an IC 150*a* including a transmitter and/or receiver mounted on a first portion of the split DAP, and another capacitive isolator device 100*b* including a laminate die 120*b* on an IC 150*c* including a transmitter and/or a receiver mounted on a separate portion of the split DAP. The isolator device package 350 analogous to the isolator device package 250 shown in FIG. 2B implements series capacitor isolation. There are bondwires 427 between the first plates 122*a* of the laminate die 120*a* and the first plates 122*b* of the laminate die 120*b*. There are leads 424 coupled to bond pads of the IC 150*a* by bondwires 128, and leads 414 coupled to bond pads of the IC 150*c* by a bondwire 427. A mold compound 160 is also shown.

As described above, one laminate die 120 having a plurality of first plates 122*a* can be used on an IC that has a plurality of second plates 152*a* and circuitry comprising at least a transmitter and/or receiver, to provide multiple HV capacitors for providing capacitive isolation for multiple channels of communication. In the specific case shown in FIG. 3B, the isolator device package 300 with its 4 HV capacitors on each of its capacitive isolator devices 100*a* and 100*b* can support four single communication channels, or two differential communication channels. This arrangement in FIG. 3B having each laminate die 120*a*, 120*b* including two or more first plates 122*a* provides a lower cost as compared to an arrangement comprising multiple laminate die each having a single HV capacitor, for which assembly would need its own pic and place operation for each laminate die onto the IC.

Figure 4:
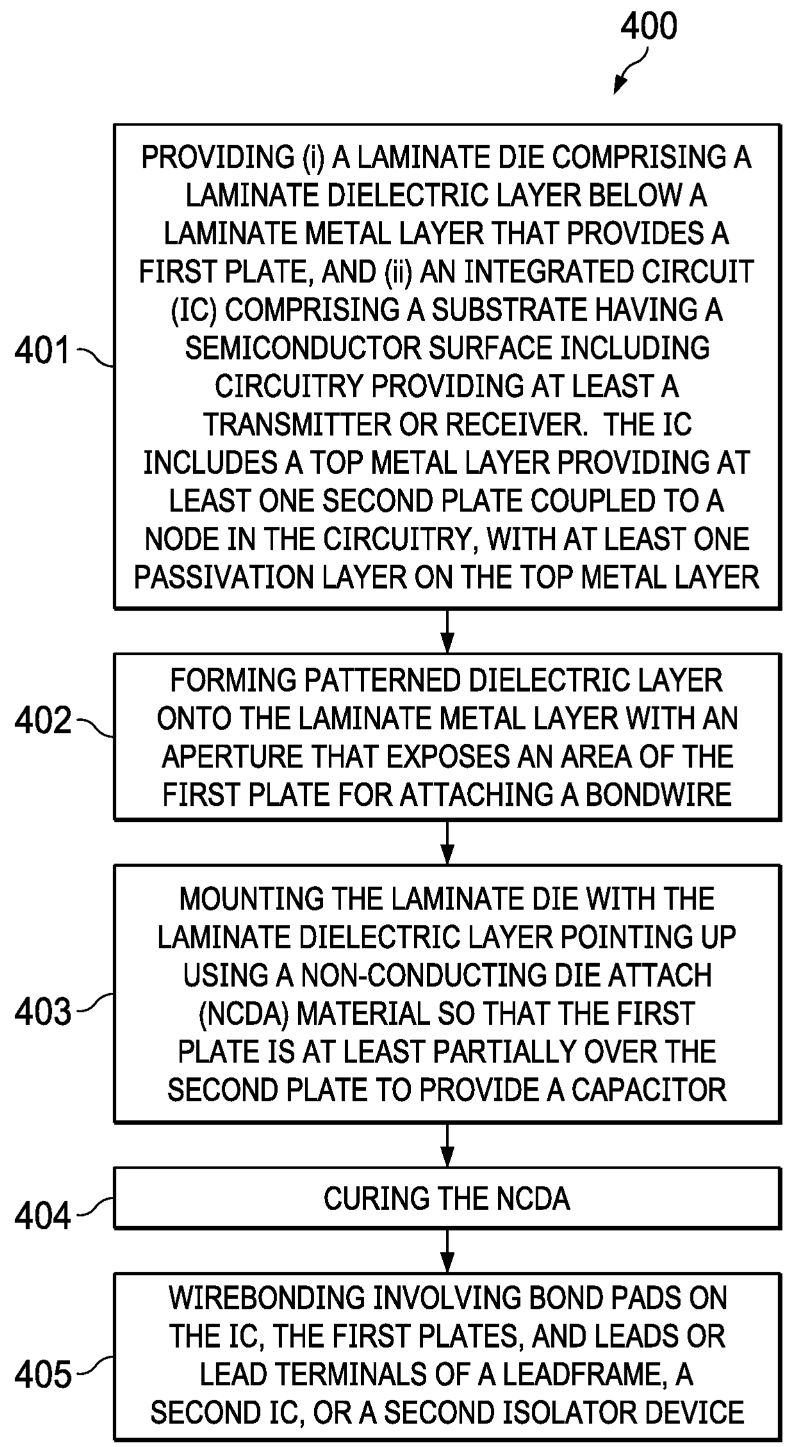
FIG. 4 is a flow chart that shows steps in an example method for forming a capacitive isolator device, according to an example aspect.

FIG. 4 is a flow chart that shows steps in an example method 400 for forming a capacitive isolator device, with reference numbers from the capacitive isolation device 100 shown in FIG. 1, according to an example aspect. Step 401 comprises providing (i) a laminate die 120 comprising a laminate dielectric layer 121 below a laminate metal layer 122 that provides a first plate 122*a*, and (ii) an IC 150 comprising a substrate 105 having a semiconductor surface including circuitry 180 providing a transmitter and/or receiver. The IC 150 includes a top metal layer 152 providing at least one second plate 152*a* coupled to a node in the circuitry 180, with at least one passivation layer 156 on the top metal layer. Step 402 comprises forming a patterned dielectric layer 126 onto the laminate metal layer with an aperture that exposes an area of the first plate 122*a* for attaching a bondwire.

Step 403 comprises mounting the laminate die with the laminate dielectric layer pointing up using an NCDA material 136 so that the first plate 122*a* is at least partially over the second plate 152*a* to provide a capacitor. As noted above, the first plate 122*a* generally has an area that is smaller as compared to an area of the second plate 152*a*, and the first plate 122*a* is generally aligned to be over at least 50% of the area of the second plate 152*a*. Step 404 comprises curing the NCDA material 136, such as by a process comprising thermal curing. Step 405 comprises wirebonding which generally follows, comprising wirebonding involving bond pads on the IC 150, the first plates 122*a*, and leads or lead terminals of a leadframe, a second IC, or a second isolator device. A plasma treatment can also be included prior to the wirebonding, which can improve the quality of the wirebond and also improve the adhesion of the mold compound to the laminate.

Disclosed aspects can be integrated into a variety of assembly flows to form a variety of different capacitive isolator devices and related products. The assembly can comprise a single semiconductor die or two or more (multiple) semiconductor die, such as configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. An isolator device, comprising:

a laminate die comprising a dielectric laminate material with a metal laminate layer on one side of the dielectric laminate material, the metal laminate layer being a patterned layer providing at least a first plate, including a dielectric layer over the first plate that includes an aperture exposing a portion of the first plate;

an integrated circuit (IC) comprising a substrate having a semiconductor surface including circuitry including at least one of a transmitter and a receiver, the IC including a top metal layer providing at least a second plate coupled to a node in the circuitry, with at least one passivation layer on the top metal layer, and a non-conductive die attach (NCDA) material for attaching a side of the dielectric laminate material opposite the metal laminate layer to the IC so that the first plate is at least partially over the second plate to provide a capacitor.

2. The isolator device of claim 1, wherein the dielectric laminate material is at least 50 μm thick.

3. The isolator device of claim 1, wherein the first plate has an area that is smaller as compared to an area of the second plate, and wherein the first plate is aligned to be over at least 50% of the area of the second plate.

4. The isolator device of claim 1, wherein the dielectric layer comprises a photoimageable polymer material that is non-electrically conductive.

5. The isolator device of claim 1, wherein the first plate comprises a plurality of the first plates, wherein the second plate comprises a plurality of second plates, and wherein the isolation device provides a plurality of the capacitors.

6. The isolator device of claim 5, wherein the transmitter or the receiver is configured with the plurality of capacitors to support at least one differential communication channel.

7. The isolator device of claim 1, wherein the passivation layer is over a full area of the second plate.

8. An isolator device package, comprising:

a leadframe having a split die attachment pad (DAP) including a first die pad and a second die pad;

a capacitive isolator device on the first die pad comprising a laminate die comprising a dielectric laminate material with a metal laminate layer on one side of the dielectric laminate material, the metal laminate layer being a patterned layer providing a first plate, including a dielectric layer over the first plate includes an aperture exposing an inner portion of the first plate; a first integrated circuit (IC) comprising a substrate having a semiconductor surface including circuitry including at least one of a transmitter and a receiver, the first IC including a top metal layer providing at least a second plate coupled to a node in the circuitry, with at least one passivation layer on the top metal layer;

a non-conductive die attach (NCDA) material for attaching a side of the dielectric laminate material opposite the metal laminate layer to the IC so that the first plate is at least partially over the second plate to provide a capacitor;

a second IC mounted on the second die pad comprising a substrate having a semiconductor surface including circuitry configured for a function including at least one of a transmitter and a receiver, and a bondwire between the first plate and a bond pad on the second IC.

9. The isolator device package of claim 8, wherein the second IC is part of a second of the capacitive isolator device including a second plurality of first plates, further comprising a bondwire coupling together the first plates on the capacitive isolator device to the second plurality of first plates provide a series capacitor.

10. The isolator device package of claim 8, further comprising a leadframe having a split die attachment pad (DAP) including a first die pad and a second die pad, wherein the first IC is on the first die pad and wherein the second IC is on the second die pad.

11. The isolator device package of claim 8, further comprising a bondwire for connecting an additional capacitor on the laminate die to a lead of the isolator device package on a same side of the leadframe split to enable capacitive sensing high voltage signals on the same side.

12. The isolator device package of claim 8, wherein the first plate comprises a plurality of the first plates, and wherein the second plate comprises a plurality of second plates, so that the isolator device provides a plurality of capacitors.

13. The isolator device package of claim 8, wherein the dielectric laminate material is at least 50 μm thick.

14. A method of fabricating an isolator device, comprising:

providing (i) a laminate die comprising a laminate dielectric layer below a dielectric laminate metal layer that provides a first plate, and (ii) an integrated circuit (IC) comprising a substrate having a semiconductor surface including circuitry providing at least one of a transmitter and a receiver, the IC including a top metal layer providing at least one second plate coupled to a node in the circuitry, with at least one passivation layer on the top metal layer;

forming a patterned dielectric layer onto the dielectric laminate metal layer with an aperture that exposes an area of the first plate for attaching a bondwire;

mounting the laminate die with the laminate dielectric layer pointing up using a non-conducting die attach (NCDA) material so that the first plate is at least partially over the second plate to provide a capacitor, and curing the NCDA.

15. The method of claim 14, further comprising wirebonding to provide a bondwire between the first plate and a bondable surface on a second IC or leads or lead terminals of a lead frame.

16. The method of claim 14, further comprising singulating a two-dimensional array of the laminate die to provide the laminate die.

17. The method of claim 14, further comprising a plasma treatment prior to the wirebonding.

18. The method of claim 14, wherein the dielectric laminate material is at least 50 μm thick.

19. The method of claim 14, wherein the first plate comprises a plurality of the first plates, wherein the second plate comprises a plurality of second plates, and wherein the isolator device provides a plurality of the capacitors.

20. The method of claim 14, wherein the first plate has an area that is smaller as compared to an area of the second plate, and wherein the mounting comprises aligning the first plate to be over at least 50% of the area of the second plate.

* * * * *